(12) United States Patent
Soree et al.

(10) Patent No.: US 9,281,040 B2
(45) Date of Patent: Mar. 8, 2016

(54) SPIN TRANSFER TORQUE MAGNETIC MEMORY DEVICE

(71) Applicant: IMEC, Leuven (BE)

(72) Inventors: Bart Soree, Begijnendijk (BE); Marc Heyns, Linden (BE); Geoffrey Pourtois, Villers-la-Ville (BE)

(73) Assignee: IMEC, Leuven (BE)

( * ) Notice: Subject to any disclaimer, the term of this patent is extended or adjusted under 35 U.S.C. 154(b) by 106 days.

(21) Appl. No.: 14/096,778

(22) Filed: Dec. 4, 2013

(65) Prior Publication Data

US 2014/0160835 A1 Jun. 12, 2014

(30) Foreign Application Priority Data

Dec. 4, 2012 (EP) ..................... 12195545

(51) Int. Cl.
| | |
|---|---|
| H01L 29/82 | (2006.01) |
| G11C 11/16 | (2006.01) |
| H01L 43/08 | (2006.01) |
| H01L 43/12 | (2006.01) |
| H01L 43/02 | (2006.01) |
| H01L 21/336 | (2006.01) |
| G11C 11/00 | (2006.01) |

(52) U.S. Cl.
CPC .......... G11C 11/161 (2013.01); G11C 11/1675 (2013.01); H01L 43/02 (2013.01); H01L 43/08 (2013.01); H01L 43/12 (2013.01)

(58) Field of Classification Search
CPC ......... H01L 43/02; H01L 43/08; H01L 43/12; G11C 11/161
USPC .................................. 257/421, 382; 438/300
See application file for complete search history.

(56) References Cited

U.S. PATENT DOCUMENTS

| | | | |
|---|---|---|---|
| 9,159,768 B2* | 10/2015 | Joo ..................... | H01L 27/2409 |
| 2011/0147816 A1 | 6/2011 | Nikonov et al. | |
| 2014/0374683 A1* | 12/2014 | Kim .................... | H01L 45/1233 257/3 |

FOREIGN PATENT DOCUMENTS

WO WO 2011/075257 A2 6/2011

OTHER PUBLICATIONS

Burkov, et al., "Weyl Semimetal in a Topological Insulator Multilayer", Sep. 20, 2011, pp. 1-4.
(Continued)

*Primary Examiner* — Long K Tran
(74) *Attorney, Agent, or Firm* — Knobbe, Martens, Olson & Bear LLP

(57) ABSTRACT

A spin transfer torque magnetic memory device is disclosed. In one aspect, the spin transfer torque magnetic memory device comprises a first layered structure stacked in a vertical direction and comprising alternating topological insulator layers and insulator layers. The memory device additionally includes a second layered structure stacked in the vertical direction and comprising alternating topological insulator layers and insulator layers. The memory device further includes a magnetic material interposing the first and second layered structures in a horizontal direction different from the vertical direction such that the magnetic material is in contact with a first side surface of the first layered structure and in contact with a first side surface of the second layered structure. Additionally, the magnetic material is configured to have a magnetization direction that can change in response to a current flowing through the magnetic material.

12 Claims, 8 Drawing Sheets

(56) References Cited

OTHER PUBLICATIONS

Dang, et al., "Epitaxial Heterostructures of Ultrathin Topological Insulator Nanoplate and Graphene", Nano Letters, Jul. 12, 2010, pp. 2870-2876.

European Search Report for Application No. 12195545.4 dated Jun. 17, 2013.

Garate, et al., "Inverse Spin-Galvanic Effect in the Interface Between a Topological Insulator and a Ferromagnet" Physical Review Letters, Apr. 9, 2010, PRL 204, pp. 146802-1-146802-4.

Kane, et al., "Topological Insulators", Physics World, Feb. 2011, pp. 32-36.

Kong, et al., "Opportunities in Chemistry and Materials Science for Topological Insulators and their Nanostructures", Nature Chemistry, Nov. 2011, vol. 3, pp. 845-849.

Moore, J., "The Birth of Topological Insulators", Nature, Mar. 2010, vol. 464, pp. 194-198.

Nikonov, et al., "Proposal of a Spin Torque Majority Gate Logic", IEE Electron Device Letters, Aug. 2011, vol. 32, No. 8, pp. 1128-1130.

Song, et al., Interfacial Dirac Cones from Alternating Topological Invariant Superlattice Structures of $Bi_2Se_3$, Physical Review Letters, Aug. 27, 2010, PRL 105, pp. 096403-1-096403-4.

Wang, et al., Superlattices of $Bi_2Se_3$/ $In_2Se_3$: Growth Characteristics and Structural Properties, Applied Physics Letters 99, Jul. 2011, pp. 023112-1-023122-3.

Zhou, et al., "Ferromagnetism in Semihydrogenated Graphene Sheet", Nano Letters, Aug. 2009, vol. 9, No. 11, pp. 3867-3870.

* cited by examiner

SPIN TRANSFER TORQUE MAGNETIC MEMORY DEVICE

CROSS REFERENCE TO RELATED APPLICATIONS

This application claims foreign priority to European patent application EP 12195545.4 filed on Dec. 4, 2012, the content of which is incorporated by reference in its entirety.

BACKGROUND OF THE INVENTION

1. Field of the Invention

The disclosed technology relates generally to memory devices, and more particularly to a spin transfer torque (STT) magnetic memory device, a method of manufacturing a spin transfer torque (STT) magnetic memory device and a method of operating a spin transfer torque (STT) magnetic memory device.

2. Description of the Related Technology

Spin transfer torque (STT) magnetic memory devices, sometimes referred to as spin transfer torque random access memory or spin torque transfer random access memory (STT-RAM) devices, refer to a category of nonvolatile memory devices that utilize a change in electrical resistance across a memory cell that can be induced through passage of spin-polarized current. WO2011075257A1, for example, describes a spin transfer torque magnetic memory device comprising a source of spin-polarized electrons and a magnetic material having a magnetization direction representing a state value of a memory bit. Some STT magnetic devices include a source of spin-polarized electrons formed of a magnetization layer, sometimes called a fixed layer, through which spin-unpolarized electrons can pass. The STT magnetic devices also include a magnetic material, sometimes called a free layer having the magnetization direction that can change in response to spin-polarized current, thereby changing the state value of the memory bit. The source of spin-polarized electrons (e.g., the fixed layer) and the magnetic material (e.g.., the free layer) are electrically arranged such that the magnetization direction of the magnetic material can be changed/switched from one direction to another (e.g., flipped) through transfer of spin momentum of the spin-polarized electrons in the magnetization direction. The changing/switching of the magnetization direction can be achieved by passage of sufficient flux of spin-polarized electrons originating from the source (e.g., the fixed layer), which subsequently pass through the magnetic layer (e.g., the free layer). The efficiency of changing/switching of the magnetization direction of the magnetic layer can depend on, among other things, the flux of spin-polarized electrons passing through, for example, the magnetic layer, as described in WO2011075257A1. Under some circumstances, as much as about half of the spin-polarized electrons can be reflected, resulting in a relatively large resistance across the fixed layer. Therefore, there is a need for more efficient STT magnetic memory device.

SUMMARY OF CERTAIN INVENTIVE ASPECTS

According to a first aspect a spin transfer torque magnetic memory device is disclosed.

The spin transfer torque magnetic memory device comprises a first layered structure and a second layered structure, the layered structures comprising alternating layers of topological insulator layers and insulator layers and a magnetic material, for having a direction of magnetization representing a value of the device, sandwiched in between the first layered structure and the second layered structure, such that each topological insulator layer of the first and the second layered structure is in direct contact with the magnet material.

According to different embodiments the spin transfer torque magnetic memory device further comprises a first electrical contact to the first layered structure and a second electrical contact to the second layered structure for applying a voltage between the first layered structure and second layered structure.

According to different embodiments the first and second electrical contact comprise a plurality of respectively first and second topological electrical contacts, each respectively first and second topological electrical contact being isolated from the respectively other first and second contacts and connected to a topological insulator layer of respectively the first and second layered structure.

According to different embodiments the first layered structure and the second layered structure and the magnetic material are electrically arranged with respect to each other such that the direction of magnetization of the magnetic material is controllable through transfer of spin of spin-polarized electrons by torque caused by the spin of spin-polarized electrons on the direction of magnetization, a current of the spin-polarized electrons being generated along the surface of the topological insulator layers by applying the voltage between the first layered structure and second layered structure.

According to different embodiments the spin of the spin-polarized electrons is directed orthogonal to the direction of the current of the spin-polarized electrons.

According to different embodiments the spin transfer torque magnetic memory device further comprises a voltage application means for applying a voltage across the first layered structure and second layered structure for controlling of the direction of magnetization of the magnetic material related to the voltage applied.

According to different embodiments the controllability of the direction of magnetization of the magnetic material is related to the voltage applied between the first layered structure and second layered structure.

According to different embodiments the magnetic material is a ferromagnet. According to more preferred embodiments the magnetic material is a soft magnetic material. According to different embodiments the magnetic material comprises graphone also known as semi hydrogenated graphene sheet. According to more preferred embodiments of the current disclosure, the thickness of the topological insulator layer is limited such as to further increase the current density of the spin-polarized electrons.

According to different embodiments the topological insulator layers comprise any one of or combinations of $Bi_2Se_3$, $Bi_2Te_3$, $Sb_2Te_3$.

According to embodiments of the current disclosure, the insulating layers are for example, but not limited to, $Al_2O_3$ or $SiO_2$.

According to different embodiments the spin transfer torque magnetic memory device further comprises a reading arrangement for determining the value of the device based on the direction of magnetization of the magnetic element.

According to different embodiments the value may be a digital value or an analogue value.

According to another inventive aspect a method for manufacturing a spin transfer torque magnetic memory device is disclosed.

The method comprises providing a layered structure, the layered structure comprising alternating layers of topological insulator layers and insulator layers; replacing part of the topological insulator layers and the insulator layers of the layered structure by a magnetic material, thereby defining a first layered structure positioned at one side of the magnetic material and having an interface with the magnetic material and defining a second layered structure in the layered structure positioned at the other side of the magnetic material and opposite to the first layered structure and having an interface with the magnetic material and providing a first electrical contact to the topological insulator layers of the first layered structure and a second electrical contact to the topological insulator layers of the second layered structure.

According to different embodiments of the method for manufacturing a spin transfer torque magnetic memory device, replacing part of the topological insulator layers and the insulator layers of the layered structure by a magnetic material comprises removing part of the topological insulator layers and the insulator layers of the layered structure thereby leaving a cavity and filling the cavity with the magnetic material.

According to another inventive aspect a method for operating a spin transfer torque magnetic memory device is disclosed.

The operating method comprises providing a first layered structure and a second layered structure, the layered structure comprising alternating layers of topological insulator layers and insulator layers and providing a magnetic material sandwiched in between the first layered structure and the second layered structure, the magnetic material having a controllable magnetization oriented an arbitrary initial state and applying a voltage between the first layered structure and the second layered structure, thereby generating a current of spin-polarized electrons along the surface of topological insulator layers wherein the spin of the spin-polarized electrons being directed orthogonal to the current of the spin-polarized electrons; the spin-polarized electrons exerting thereby a spin torque to the magnetization of a magnetic layer, thereby controlling the direction of the magnetization of the magnetic material to a second state being towards the direction of the spin of the spin-polarized electrons and determining the second state of the direction of the magnetization of the magnetic material in response to the applied voltage and determining a value based on the determined second state of the direction of the magnetization.

According to embodiments of a method for operating a spin transfer torque magnetic memory device applying a voltage between the first layered structure and the second layered structure comprises applying an independent voltage between each of the topological insulator layers of the first layered structure and the topological insulator layers of the second layered structure.

According to embodiments of a method for operating a spin transfer torque magnetic memory device the arbitrary initial state of the direction of the magnetization of the magnetic material is anti-parallel to spin of the spin-polarized electrons and wherein the second state of the direction of the magnetization of the magnetic material is parallel to the spin of the spin-polarized electrons.

According to embodiments of a method for operating a spin transfer torque magnetic memory device, determining the value may comprise determining a digital value or determining an analogue value.

According to another aspect the use of a topological insulator for a spin transfer torque magnetic memory device is disclosed.

According to embodiments, the use of a topological insulator in a spin transfer torque magnetic memory comprises controlling the direction of magnetization of a magnetic material of the magnetic memory, the direction of magnetization representing the value of a bit of the magnetic memory, by applying an electric field along the surface of the topological insulator such that a current of spin-polarized electrons is generated along the surface of the topological insulator, wherein the topological insulator and the magnetic material are arranged with respect to each other such that the direction of magnetization of the magnetic material is controllable through transfer of spin of the spin-polarized electrons by torque caused by the spin of the spin-polarized electrons on the direction of magnetization.

It is an advantage of embodiments of the current disclosure that due to the layered structure the total surface area which can provide the current of spin-polarized electrons for the spin transfer torque magnetic memory device can be increased, leading to an improved control of the direction of the magnetization of the magnetic material.

It is an advantage of embodiments of the current disclosure that a better transfer of spin torque can be provided due to the better magnetic properties of the ferromagnetic material of the spin transfer torque magnetic memory device. Without wanting to be bound by any theory it is thought that the improved STT is related to the spin related aspects of ferromagnetism.

It is an advantage of embodiments of the current disclosure that magnetization of the direction of magnetization in soft magnetic materials can be relatively easy controlled with respect to, for example, hard magnetic materials.

It is an advantage of embodiments of the current disclosure that the interaction between the current of spin-polarized electrons and the direction of magnetization of the magnetic material can be improved as the magnetic material of the spin transfer torque magnetic memory device is relatively thin.

It is an advantage of embodiments of the current disclosure that there is no requirement of using a hard magnetic material to spin-polarize incoming electrons as used in prior art spin transfer torque magnetic memory device. The use of hard magnetic material has the disadvantage that current is spin filtered due to the fact that part of the spin electrons are reflected. The reflection of electrons having the wrong spin polarization results in a larger resistance when compared to this claim.

It is an advantage of embodiments of the current disclosure that the current of spin polarized electrons is quasi dissipationless due to the absence of backscattering (which is present when using a hard magnetic material).

It is an advantage of embodiments of the current disclosure that a spin transfer torque memory device is proposed having a cost-effective and simple fabrication scheme.

It is an advantage of embodiments of the current disclosure that a wide range of applications are possible for both digital as well as analogue applications, such as for example signal image processing.

BRIEF DESCRIPTION OF THE DRAWINGS

The disclosure will be further elucidated by means of the following description and the appended figures.

DETAILED DESCRIPTION OF CERTAIN ILLUSTRATIVE EMBODIMENTS

Figure 1:
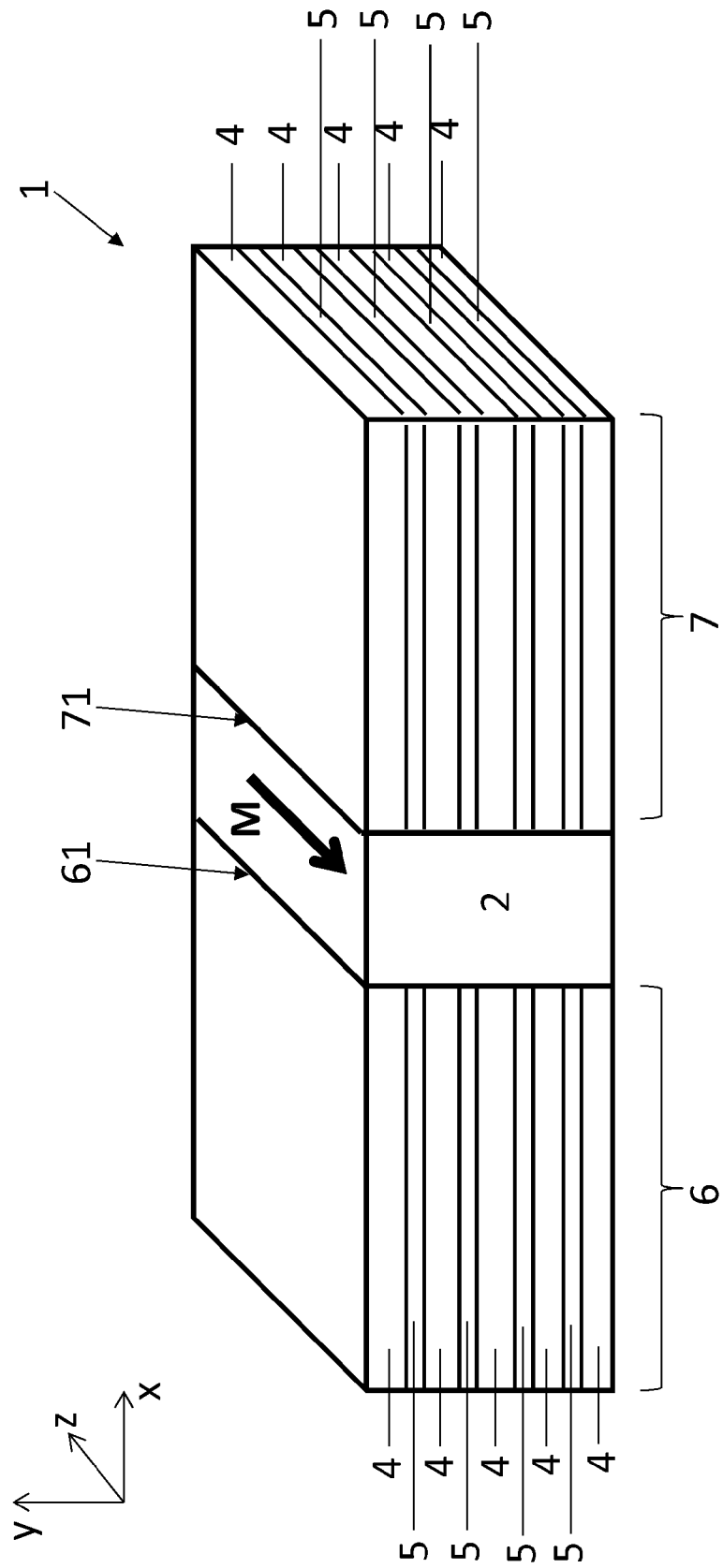
FIG. 1 shows a schematic three dimensional (3D) view of a spin transfer torque magnetic memory device according to some embodiments.

In the following detailed description, numerous specific details are set forth in order to provide a thorough understanding of the disclosure and how it may be practiced in particular embodiments. However, it will be understood that the present disclosure may be practiced without these specific details. In other instances, well-known methods, procedures and techniques have not been described in detail, so as not to obscure the present disclosure. While the present disclosure will be described with respect to particular embodiments and with reference to certain drawings, the disclosure is not limited hereto. The drawings included and described herein are schematic and are not limiting the scope of the disclosure. It is also noted that in the drawings, the size of some elements may be exaggerated and, therefore, not drawn to scale for illustrative purposes.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

Whereas reference is made to a (x,y,z) coordinate system, it should be appreciated by a person skilled in the art this is only for illustrative purpose and coordinates can be interchanged.

As used herein, a topological insulator refers to a material that can be semiconducting or insulating in the bulk, while having a conducting (e.g., metallic) surface/interface. The conducting surface/interface can have a Dirac cone energy dispersion relation. That is, a topological insulator is a material that can behave as an insulator in its interior, while permitting movement of charges on its surface/interface. Examples of topological insulators include materials comprising bismuth telluride or bismuth selenide.

The magnetization of a magnetized material refers to the local value of its magnetic moment per unit volume, usually denoted M, measured in amperes per meter (A/m) in SI units.

It has been found that under certain configurations of the spin transfer torque magnetic memory devices described herein, the current of spin-polarized electrons can be created in a more efficient way as a current of spin-polarized electrons is generated along the surface of the topological insulator by applying an electric field along the surface of the topological insulator due to the relation between the electrons' motion and the spin.

Moreover, it has been found that the transport of the electrons along the surface of the topological insulator is subject to less energy dissipation. As a result, the topological insulators can further reduce the overall impedance of the resulting memory device and, can further reduce Joule heating of the memory device, thereby reducing the overall energy needed to operate the memory.

In various embodiments described herein, the source of spin-polarized electrons comprises a topological insulator provided such that by applying an electric field along the surface of the topological insulator the current of spin-polarized electrons is generated along the surface of the topological insulator.

FIG. 1 shows a schematic three dimensional (3D) view illustrating a spin transfer torque (STT) magnetic memory device according to some embodiments.

The spin transfer torque magnetic memory device 1 comprises a first layered structure 6 and a second layered structure 7 with a magnetic material 2 sandwiched in between. Each of the first 6 and second 7 layered structures comprises alternating layers of topological insulator layers 4 and insulator layers 5.

Still referring to FIG. 1, the magnetic material 2 can have an arbitrary initial state of magnetization $M_{init}$, i.e. a vector quantity having an arbitrary initial direction and an initial magnitude. For example, the direction of the magnetization $M_{init}$ of the magnetic material 2 can extend in a direction parallel to the plane of the surface of the magnetic memory device 1. In the illustrated embodiment of FIG. 1, the direction of the magnetization $M_{init}$ of the magnetic material 2 extends parallel to the (x,z)-surface and parallel to z-direction (i.e. parallel to planes formed by interfaces 61, 71 formed between the layered structures 6,7 and the magnetic material 2). The direction of the magnetization $M_{init}$ of the magnetic material 2 is however not limited to this direction, but can extend in other directions (for instance orthogonal or under an angle to the interfaces 6,7 between the layered structures 6,7 and the magnetic material 2) in the (x,z)-surface.

In the illustrated embodiment of FIG. 1, the first layered structure 6, the second layered structure 7 and the magnetic material 2 are arranged such that each of the topological insulator layers 4 of the first layered structure 6 and each of the second layered structure 7 are in contact with the magnetic material 2. As used herein, structures in contact with each other are in direct physical contact. That is, in the illustrated embodiment of FIG. 1, a physical contact exists between the topological insulator layers 4 of the first layered structure 6 and the second layered structure 7 and the magnetic material 2. There is thus a first interface 61 formed between the first layered structure 6 and the magnetic material 2 and a second interface 71 formed between second layered structure 7 and the magnetic material 2. In addition, in some embodiments, the insulator layers 5 are in direct contact with the magnetic material 2. Thus, the first interface 61 is formed between the first layered structure 6 and the magnetic material 2, where the first interface 61 extends parallel to the (y,z) plane, and the second interface 71 is formed between the magnetic material 2 and the second layered structure 7, where the second interface 71 extends parallel to the first interface 61 (and thus also parallel to the (y,z) plane).

In some embodiments, the magnetic material 2 is formed of an electrically conductive material and is electrically connected to the first 6 and second 7 layered structures.

In some embodiments, the magnetic material 2 comprises or is formed of a soft ferromagnetic material such as for example iron, cobalt, Nickel, Heusler alloys, and ferromagnetic oxides, among others. As used herein, a soft magnetic material is a magnetic material which can be relatively easily magnetized and demagnetized, and has a coercivity below about 5 Oe.

In some embodiments, the magnetic material 2 comprises or is formed of graphone (also known as semi hydrogenated graphene).

FIGS. 1 to 8 show that the magnetic material 2 is substantially beam shaped. However, the magnetic material 2 can have any shape and/or dimension deemed appropriate by the person skilled in the art for the envisaged configuration.

Still referring to FIG. 1, in some embodiments, the first and second layered structures 6, 7 of the magnetic memory device 1 comprise the same layers of topological insulators 4 and layers of insulators 5. The magnetic memory of FIG. 1 can be fabricated using any number of suitable methods. In one implementation, the first and second layered structures 6, 7 may be formed by first forming a common layered structure and thereafter removing a middle portion of the common layered structure. At one side of the middle part a first layered structure 6 may then be defined. At the another side of the middle part a second layered structure 7 may then be defined. The common layered structure may be formed by, for example, growing alternating layers of topological insulators 4 and layers of insulators 5, using deposition techniques such as epitaxial growth techniques, MBE, ALD, CVD or sputtering, among others. Subsequently, a portion of the common layered structure may be removed by using etching techniques such that both the topological insulators 4 and layers of insulators 5 are removed. A cavity is thereby created which may be filled again in a subsequent process with the magnetic material 2.

It is an advantage of certain embodiments that a number of layers may be used for a spin transfer torque magnetic memory device thereby enabling the current to penetrate the bulk of the soft magnetic material. The number of layers (or number of topological insulator layers 4) of the spin transfer torque magnetic memory device may be chosen in function of the thickness of the magnetic material 2, the thickness of the topological insulator layers 4 and the thickness of the insulator layers 5.

The topological insulator layers 4 may be formed of materials comprising $Bi_2Se_3$, $Bi_2Te_3$, $Sb_2Te_3$, α-Sn, all Heusler and half-Heusler compounds classified as topological insulators, pyrochlore oxides of the type $A_2B_2O_7$, and $Ge_2Sb_2Te_5$, among others.

The insulator layers 5 may be formed of materials comprising $SiO_2$, $Al_2O_3$, $GeO_2$, and $HfO_2$, among others. An example of a layered structure may be formed of, for example, alternating layers formed of $Al_2O_3$ and $Bi_2Te_3$ layers or alternating layers formed of $HfO_2$ and $Bi_2Se_3$ layers.

In some embodiments, the thickness of the topological insulator layers 4 is limited so as to further increase the current density of the spin-polarized electrons. However, the thickness of the topologic insulator layers 4 should not be too limited so as not decrease the topological insulator effect requiring sufficient bulk material. The thickness of the topological insulator layers 4 can be, for example, in the range between about 1 nm and about 10 nm.

The thickness of the insulator layers 5 can vary, so long as the different topological insulator layers 4 are isolated from each other. In some embodiments, the thickness of the insulator layers 5 can be minimized to be, for example, in a range between about 2 nm to about 10 nm.

For example a layered structure of at least six layers of unit cells, for instance in case of $Bi_2Se_3$ five to six quintuple atom layers, of the topological insulator layers may be provided, at least when the topological insulator primarily comprises $Bi_2Se_3$, to be sufficiently thick. The material of the topological insulator is however not limited to $Bi_2Se_3$ but the topological insulator may comprise any one of or combinations of $Bi_2Se_3$, $Bi_2Te_3$, $Sb_2Te_3$ or any other material known to the person skilled deemed appropriate.

Also, electrical contacts can be provided to the spin transfer torque magnetic memory device 1. In the following, different implementations of providing the electrical contacts are described.

Figure 2:
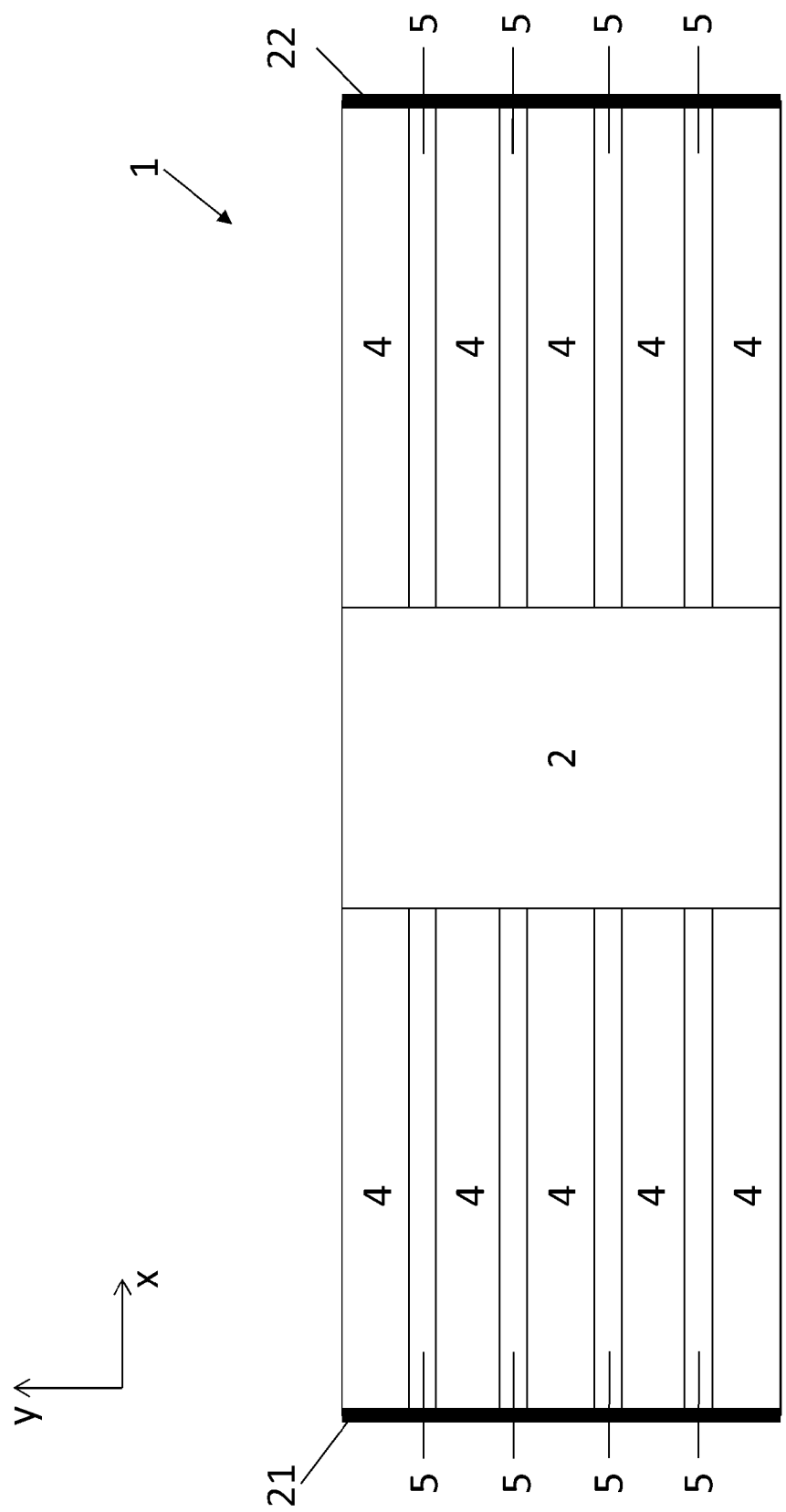
FIGS. 2 and 3 are schematic side views illustrating a spin transfer torque magnetic memory according to different embodiments.

Referring to FIG. 2, according to some embodiments, a common first electrical contact 21 may be provided at the (outer) side of the first layered structure 6 thereby electrically contacting all the topological insulators 4 and layers of insulators 5 of the first layered structure 6 together. In addition, a common second electrical contact 22 may be provided at the (outer) side of the second layered structure 7 thereby electrically contacting all the topological insulators 4 and layers of insulators 5 of the second layered structure 7 together.

Figure 3:
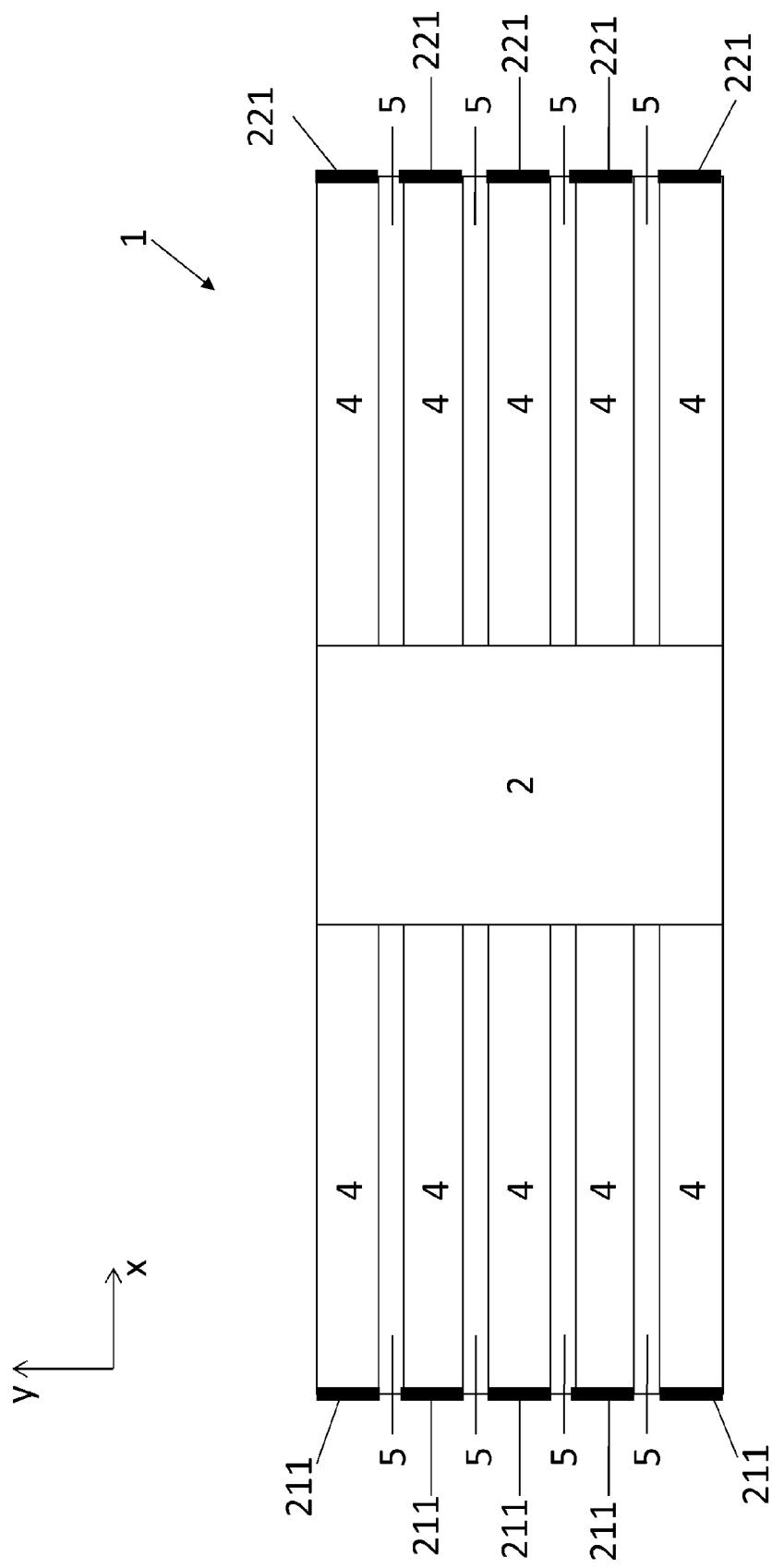

Referring to FIG. 3, according to other embodiments, the topological insulator layers 4 of the first layered structure 6 may be contacted separately. In this configuration, different electrical contacts 211 are provided at the (outer) side of the topological insulator layers 4 of the first layered structure 6. The different electrical contacts 211 are thus (electrically and physically) isolated from each other. In addition, the topological insulator layers 4 of the second layered structure 7 may be contacted separately. In this configuration, different electrical contacts 221 are provided at the (outer) side of the topological insulator layers 4 of the second layered structure 7. The different electrical contacts 221 are thus (electrically and physically) isolated from each other.

In some embodiments, it can be advantageous to provide different electrical contacts to the topological insulator layers 4 separately such that each topological insulator layer 4 can be operated separately. In these embodiments, the spin transfer torque magnetic memory may be used for logic and/or analog applications. An example will be elaborated further in FIG. 8.

Figure 4:
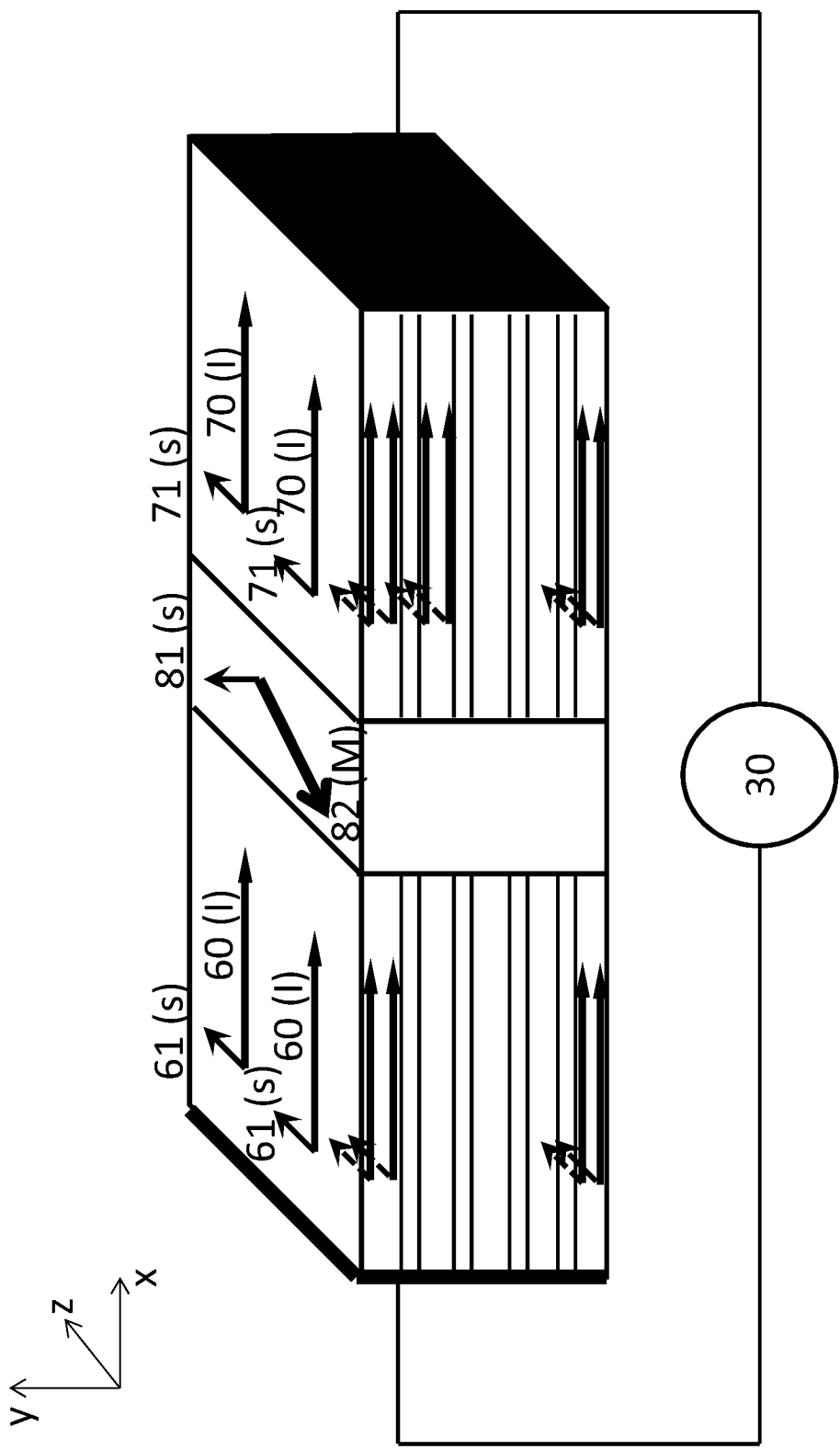
FIG. 4 is a schematic three dimensional (3D) view illustrating a spin transfer torque magnetic memory device and a method of operating such a device according to some embodiments.
Figure 5:
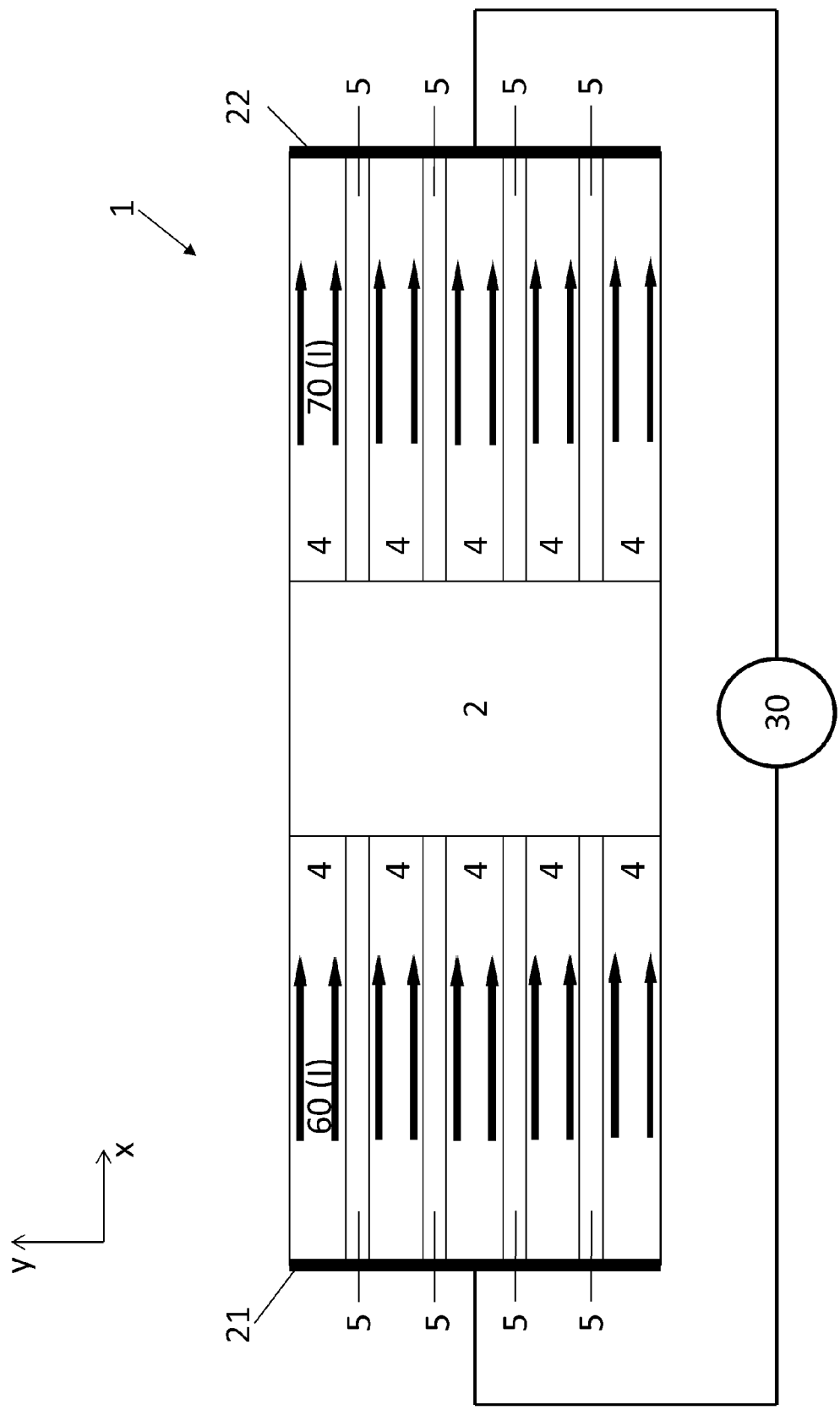
FIG. 5 shows a schematic side view illustrating a spin transfer torque magnetic memory device and a method of operating such a device according to some embodiments.
Figure 6A:
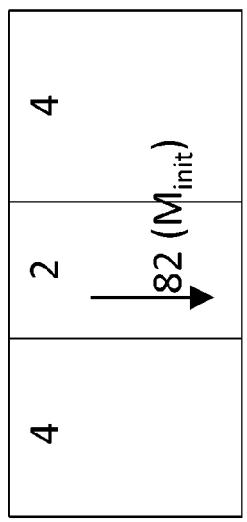
FIGS. 6a-6c show top views of illustrating a spin transfer torque magnetic memory device and a method for operating such a device according to some embodiments.
Figure 6B:
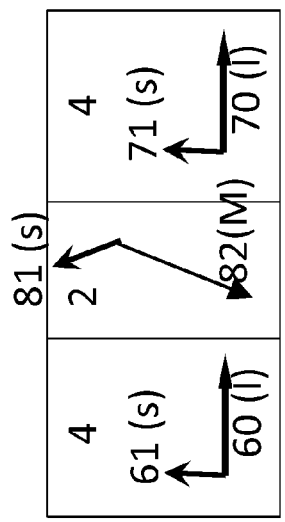
Figure 6C:
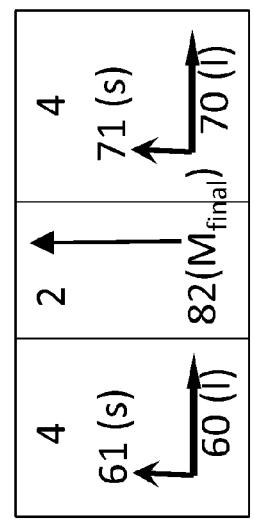

FIGS. 4 and 5 show schematic 3D and 2D representations, respectively, of a spin transfer torque magnetic memory 1 in operation according to some embodiments of the present disclosure.

By applying an electric field/a voltage 30 between the first 6 and the second 7 layered structures, a current (arrows 60, 70 I) of spin-polarized electrons is generated along the surface of the topological insulator layers 4. The first layered structure 6 and the second layered structure 7 and the magnetic material 2 are electrically arranged with respect to each other such that the direction of magnetization (arrow 82 M) of the magnetic material 2 is controllable through transfer of spin of spin-polarized electrons by torque caused by the spin (arrows 61,71 s) of spin-polarized electrons in the direction of magnetization (arrow 82 M), a current (arrows 60, 70 I) of the spin-polarized electrons being generated along the surface of the topological insulator layers 4 by applying the voltage 30 between the first layered structure 6 and second layered structure 7.

In the illustrated embodiments of FIGS. 4 and 5, the spin (arrows 61, 71 s) of the spin-polarized electrons is directed orthogonal to the direction of the current (arrows 60, 70 I) of the spin-polarized electrons.

The controllability of the direction of magnetization (arrow 82 M) of the magnetic material 2 is dependent on the voltage 30 which is applied between the first 6 and the second 7 layered structures. The operating voltage 30 is dependent on the materials used, the band offset of the materials used, and the perpendicular anisotropy of the material, among others.

In some embodiments, the direction of magnetization (arrow 82 M) of the magnetic material 2 represents a state value of the memory device. For example, depending on the direction of magnetization (arrow 82 M) of the magnetic material 2, the state value, which may be a bit value, can represent logical 0 (zero) or logical 1 (one). In other embodiments, the state value may represent an analog value.

Figure 7A:
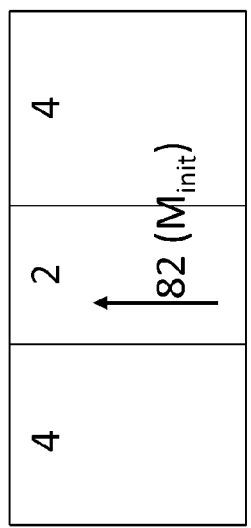
FIGS. 7a-7c show top views illustrating a spin transfer torque magnetic memory device and a method for operating such a device according to some embodiments.
Figure 7B:
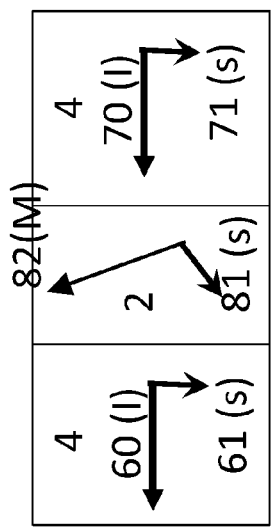
Figure 7C:
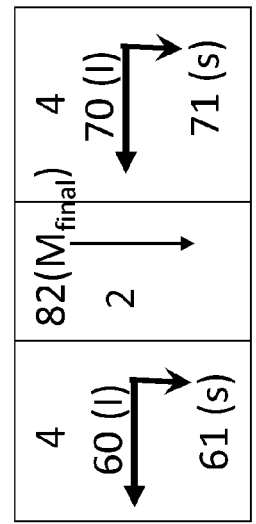

Referring to FIGS. 6a to 6c and FIGS. 7a to 7c, schematic representations of a method of operating a spin transfer torque magnetic memory device 1 are illustrated, according to some embodiments, for example for writing a bit representing logical 0 (zero) or logical 1 (one). In particular, these embodiments illustrate the use of a topological insulator 4 in a spintransfer torque magnetic memory 1 for writing a bit representing logical 0 (zero) (FIGS. 6a-6c) and for writing a bit representing logical 1 (one) (FIGS. 7a-7c). In FIGS. 6a-6c and FIGS. 7a-7c, arrows 61,71 s represent the general spin of the spin-polarized electrons, arrows 60, 70 I represent the current density and arrow 82 M represents the magnetization of the magnetic material 2. $M_{init}$ represents the initial arbitrary magnetization state of the magnetic material 2, i.e. the magnetization state prior to applying a voltage between the first 6 and the second 7 layered structures. When a voltage is applied between the first 6 and the second 7 layered structures, the direction of magnetization M can be changed (e.g., flipped) in response to the current of spin polarized electrons inducing a torque. $M_{final}$ represents the final magnetization state of the magnetic material 2 after applying the voltage. It is seen that the direction of magnetization may thus vary from an arbitrary initial direction $M_{init}$ towards a final direction $M_{final}$ which may be, for example, a direction of magnetization M or a direction of magnetization in parallel with the spin s of the spin polarized electrons). The transfer of spin of the spin-polarized electrons by torque is exemplified by the change in the direction of the magnetization M.

The change in direction of the current density I can be achieved by for example accordingly applying a different electric field having substantially opposing, or even opposing, directions along the surface of the topological insulator 4 as shown schematically in FIGS. 7a to 7c. In FIG. 7a, a voltage is applied between the second 7 layered structure and the first 6 layered structure such that a current of spin polarized electrons is induced in the direction as shown by arrows 60, 70 I. The spin, arrows 61,71 s, of the spin polarized electrons is directed orthogonal to the direction of the current, i.e. in this example spin down. The initial magnetization $M_{init}$ is in a direction antiparallel to the spin s. Due to the voltage applied a spin torque is induced as such controlling the direction of magnetization. Depending on the voltage applied (magnitude), the direction of magnetization will change towards a direction $M_{final}$ parallel to the spin s.

Figure 8:
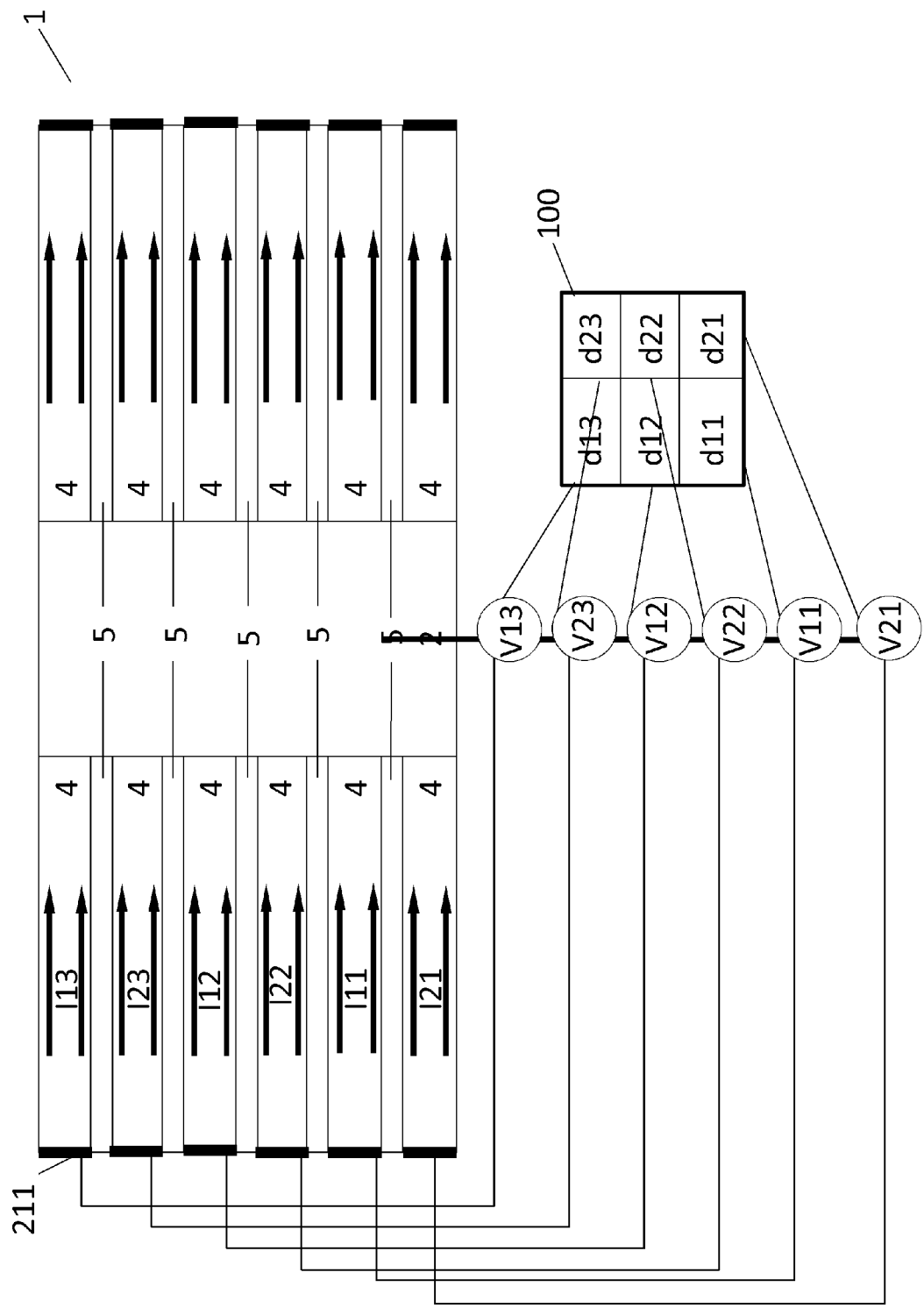
FIG. 8 is a schematic presentation illustrating an application of a spin transfer torque magnetic memory device according to some embodiments.

FIG. 8 shows a schematic example of a possible application with a spin transfer torque magnetic memory device according to embodiments of the invention. A spin transfer torque magnetic memory device is represented with a layered structure comprising 6 topological insulator layers 4. Each of the topological insulator layers 4 has an electrical contact for applying a voltage such that a current of spin polarized electrons may be induced ad the surface of each of the topological insulator layers 6. A schematic image 100 is shown with in this example 6 different cells. Each cell may for example represent a pixel, black or white (i.e digital 0 or 1). Or even more general, each cell may for example represent a pixel with a random value (i.e. analogue). The spin transfer torque magnetic memory device comprises as many topological insulators as there are pixels in the image as such enabling the use of the STT magnetic memory device as a signal processing system. Each of the pixels d11, d12, d13, d21, d22, d23 is connected to each of the topological insulator layers 4. Depending on the value of the pixel, a voltage (corresponding to the value of the pixel/cell) V11, V12, V13, V21, V22, V23 is applied to the corresponding topological layer. Each of the voltages V11, V12, V13, V21, V22, V23 will induce a current I11, I12, I13, I21, I22, I23 of spin polarized electrons at the surface of the corresponding topological layer 4. The current I11, I12, I13, I21, I22, I23 of spin polarized electrons will thereby control the direction of magnetization of the magnetic material 2 and for each of the voltages VI, V12, V13, V21, V22, V23 a corresponding direction of magnetization M11, M12, M13, M21, M22, M23 will be induced (due to spin torque). Each of the direction of magnetization M11, M12, M13, M21, M22, M23 achieved after applying the voltage V11, V12, V13, V21, V22, V23 may be read out using a reading element. As such the spin transfer torque magnetic memory device may be used as a signal processing system.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A spin transfer torque magnetic memory device comprising:
   a first layered structure stacked in a vertical direction and comprising alternating topological insulator layers and insulator layers;
   a second layered structure stacked in the vertical direction and comprising alternating topological insulator layers and insulator layers; and a magnetic material interposing the first and second layered structures in a horizontal direction such that the magnetic material is in contact with a first side surface of the first layered structure and in contact with a first side surface of the second layered structure, wherein the magnetic material has a magnetization direction that represents a state value.

2. The memory device of claim 1, further comprising:

a first electrical contact formed on a second side surface of the first layered structure; and a second electrical contact formed on a second side surface of the second layered structure, wherein the first and second electrical contacts are configured to develop an electric field across the first and second layered structures in response to a voltage applied between the first and second electrical contacts.

3. The memory device of claim 2, wherein the first electrical contact comprises a plurality of first topological electrical contacts formed on side surfaces of topological insulator layers of the first layered structure, wherein each first topological electrical contact is isolated from other first topological electrical contacts, and wherein the second electrical contact comprises a plurality of second topological electrical contacts formed on side surfaces of topological insulators of the second layer structure, wherein each second topological electrical contact is isolated from other second topological electrical contacts.

4. The memory device of claim 2, wherein the first and second electrical contacts are configured to induce a flow of spin-polarized electrons through the magnetic material in response to the voltage, wherein the magnetization direction of the magnetic material is configured to change in response to transfer of spin of spin-polarized electrons by torque of the spin of spin-polarized electrons in the direction of magnetization, and wherein the topological insulators of the first and second layered structures are configured to carry a current of the spin-polarized electrons generated along the surface of the topological insulator layers in response to the voltage.

5. The memory device of claim 4, wherein the spin of the spin-polarized electrons is directed in a direction orthogonal to a direction of flow of the current of the spin-polarized electrons.

6. The memory device of claim 4, further comprising:

a voltage source configured to apply the voltage across the first layered structure and across the second layered structure for changing the magnetization direction of the magnetic material in response to the voltage.

7. The memory device of claim 1, wherein the magnetic material comprises a soft magnetic material.

8. The memory device of claim 7, wherein the magnetic material has a coercivity below about 5 Oe.

9. The memory device of claim 1, wherein the magnetic material comprises graphone.

10. The memory device of claim 1, wherein the topological insulators comprise a conducting surface and a bulk that is insulating or semiconducting.

11. The memory device of claim 10, wherein the topological insulator layers comprise at least one of $Bi_2Se_3$, $Bi_2Te_3$ and $Sb_2Te_3$.

12. The memory device of claim 1, wherein the magnetic material is configured to have a magnetization direction that changes in response to a current flowing through the magnetic material.

* * * * *